US011094507B2

(12) United States Patent
Funk et al.

(10) Patent No.: US 11,094,507 B2
(45) Date of Patent: Aug. 17, 2021

(54) POWER GENERATION SYSTEMS AND METHODS FOR PLASMA STABILITY AND CONTROL

(71) Applicant: Tokyo Electron Limited, Tokyo (JP)

(72) Inventors: Merritt Funk, Austin, TX (US); Chelsea DuBose, Austin, TX (US); Justin Moses, Austin, TX (US); Kazuki Moyama, Miyagi (JP); Kazushi Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/517,779

(22) Filed: Jul. 22, 2019

(65) Prior Publication Data

US 2021/0027992 A1 Jan. 28, 2021

(51) Int. Cl.
*H03F 3/68* (2006.01)
*H01J 37/32* (2006.01)
(Continued)

(52) U.S. Cl.
CPC ...... *H01J 37/32183* (2013.01); *H03F 1/0288* (2013.01); *H03F 1/56* (2013.01);
(Continued)

(58) Field of Classification Search
CPC . H03F 1/0288; H03F 3/21; H03F 1/56; H03F 2200/387; H03F 2200/451;
(Continued)

(56) References Cited

U.S. PATENT DOCUMENTS 7,362,170 B2 * 4/2008 Louis .................... H03F 1/0288 330/124 R
7,388,433 B1 * 6/2008 Hecht ....................... H03F 3/19 330/124 R (Continued)

FOREIGN PATENT DOCUMENTS

JP 2018160333 A 10/2018
WO 2014021932 A1 4/2012

OTHER PUBLICATIONS

Korean Intellectual Property Office, The International Search Report and the Written Opinion for International application No. PCT/US2020/037870, dated Oct. 7, 2020, 14 pg.

*Primary Examiner* — Khanh V Nguyen
(74) *Attorney, Agent, or Firm* — Slater Matsil, LLP

(57) ABSTRACT

Embodiments are described herein for power generation systems and methods that use quadrature splitters and combiners to facilitate plasma stability and control. For one embodiment, a quadrature splitter receives an input signal and generates a first and second signals as outputs with the second signal being ninety degrees out of phase with respect to the first signal. Two amplifiers then generate a first and second amplified signals. A quadrature combiner receives the first and second amplified signals and generates a combined amplified signal that represents re-aligned versions of the first and second amplified signals. The power amplifiers can be combined into a system to generate a high power output to a processing chamber. Further, detectors can generate measurements used to monitor and control power generation. The power amplifiers, system, and methods provide significant advantages for high-power generation delivered to process chambers for plasma generation during plasma processing.

22 Claims, 6 Drawing Sheets

(51) Int. Cl.

| | |
|---|---|
| ***H03F 3/21*** | (2006.01) |
| ***H03F 1/02*** | (2006.01) |
| ***H03F 1/56*** | (2006.01) |

(52) U.S. Cl.
CPC ......... *H03F 3/21* (2013.01); *H03F 2200/222* (2013.01); *H03F 2200/387* (2013.01); *H03F 2200/451* (2013.01)

(58) Field of Classification Search
CPC ........ H03F 2200/222; H03F 3/20; H03F 3/19; H03F 3/24; H03F 1/565; H03F 3/195; H03F 3/245; H03F 3/602; H03F 3/211; H03F 3/607; H03F 3/60; H03F 3/3211; H03F 3/604; H01L 23/66; H01L 2223/6655; H01L 2223/6611
USPC ...................................... 330/124 R, 286, 295
See application file for complete search history.

(56) References Cited

U.S. PATENT DOCUMENTS

| | | | | |
|---|---|---|---|---|
| 7,411,450 | B2 * | 8/2008 | Albrecht ............ | G01R 33/3621 330/124 R |
| 8,847,681 | B2 * | 9/2014 | Namerikawa ........... | H01P 5/187 330/126 |
| 9,780,733 | B2 * | 10/2017 | Jeon .......................... | H03F 1/42 |
| 9,787,262 | B2 * | 10/2017 | Schenk ..................... | H03F 1/42 |
| 9,948,243 | B2 * | 4/2018 | Kobayashi ................ | H03F 1/56 |
| 2005/0134377 | A1 * | 6/2005 | Dent ..................... | H03F 1/0288 330/124 R |
| 2006/0119433 | A1 | 6/2006 | Proehl | |
| 2012/0098595 | A1 | 4/2012 | Stockert | |
| 2015/0270104 | A1 | 9/2015 | Van Zyl | |

* cited by examiner

POWER GENERATION SYSTEMS AND METHODS FOR PLASMA STABILITY AND CONTROL

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Plasma processing systems are used to perform etch, deposition, and other processes for the manufacture of microelectronic workpieces. Plasma processing systems include power generation systems that generate radio frequency (RF) energy, such as microwave energy. This RF energy is used in part to ignite and maintain plasma with a process chamber that includes a microelectronic workpiece being processed. Plasma stability control is important in order to achieve target process parameters for these microelectronic workpieces. Traditional power amplifiers and related power generation systems for plasma processing systems often suffer from interference and other factors that degrade stability of the plasma, degrade the electronics within the power generation systems, and/or otherwise degrade the performance of the plasma process equipment.

SUMMARY

Embodiments are described herein for power generation systems and methods that use quadrature splitters and combiners to facilitate plasma stability and control. Different or additional features, variations, and embodiments can also be implemented, and related systems and methods can be utilized as well.

For one embodiment, a power amplifier is disclosed including a quadrature splitter coupled to receive an input signal and having a first and second signals as outputs where the second signal is ninety degrees out of phase with respect to the first signal, a first amplifier coupled to the first signal and having a first amplified signal as an output, a second amplifier coupled to the second signal and having a second amplified signal as an output where the second amplified signal is ninety degrees out of phase with respect to the first amplified signal, and a quadrature combiner coupled to receive the first and second amplified signals and having a combined amplified signal as an output where the combined amplified signal includes re-aligned versions of the first and second amplified signals.

In additional embodiments, the combined amplified signal includes a radio frequency (RF) signal having an output power greater than or equal to 500 watts at a frequency greater than or equal to two gigahertz. In further additional embodiments, the first amplifier and the second amplifier each include one or more transistor amplifiers. In further embodiments, the one or more transistor amplifiers include gallium nitride (GaN) transistors.

For one embodiment, a power amplifier system is disclosed including a splitter coupled to receive an input signal and having a plurality of split signals as outputs, a plurality of power amplifiers having combined amplified signals as outputs, and a combiner coupled to receive the combined amplified signals from the plurality of power amplifiers and to provide a combined output signal. Further, each power amplifier includes a quadrature splitter coupled to receive one of the split signals and having a first and second signals as outputs where the second signal is ninety degrees out of phase with respect to the first signal, a first amplifier coupled to the first signal and having a first amplified signal as an output, a second amplifier coupled to the second signal and having a second amplified signal as an output where the second amplified signal is ninety degrees out of phase with respect to the first amplified signal, and a quadrature combiner coupled to receive the first and second amplified signals and having a combined amplified signal as an output where the combined amplified signal includes re-aligned versions of the first and second amplified signals.

In additional embodiments, the combined amplified signal for each of the power amplifiers includes a radio frequency (RF) signal having an output power greater than or equal to 500 watts at a frequency greater than or equal to two gigahertz. In further embodiments, the combined output from the combiner is provided to a plasma process chamber, and the quadrature combiner filters interference generated by plasma within the plasma process chamber.

In additional embodiments, the PA system also includes one or more detectors coupled to the power amplifier system and having measurements as outputs and a controller coupled to receive the measurements and to adjust operation of the power amplifier system based upon the measurements. In further embodiments, the one or more detectors include a plurality of power detectors with a power detector being coupled to the quadrature combiner within each power amplifier. In further embodiments, each power amplifier further includes a directional coupler coupled to the combined amplified signal and having a forward power signal and a reverse power signal as outputs, and the one or more detectors include one or more power detectors coupled to the directional coupler within each power amplifier.

In additional embodiments, the system also includes a non-volatile storage system storing operational data associated with the one or more detectors. In further embodiments, the controller is coupled to adjust operation of the power amplifier system based upon a comparison of the measurements to the operational data. In still further embodiments, the operational data includes upper limits and lower limits.

For one embodiment, a method is disclosed including splitting an input signal with a quadrature splitter to generate a first and second signals where the second signal is ninety degrees out of phase with respect to the first signal, amplifying the first signal to generate a first amplified signal, amplifying the second signal to generate a second amplified signal where the second amplified signal is ninety degrees out of phase with respect to the first amplified signal, and combining the first and second amplified signals with a quadrature combiner to generate a combined amplified signal where the combined amplified signal includes re-aligned versions of the first and second amplified signals.

In additional embodiments, the combined amplified signal includes a radio frequency (RF) signal having an output power greater than or equal to 500 watts at a frequency greater than or equal to two gigahertz.

In additional embodiments, the splitting, amplifying, and combining are performed within a plurality of power amplifiers. In further embodiments, the method also includes combining the combined amplified signals from the plurality of power amplifiers to generate a combined output signal. In further embodiments, the input signals for the plurality of power amplifiers include split signals from a splitter.

In additional embodiments, the method also includes adjusting at least one of the splitting, amplifying, or combining based upon measurements from one or more detectors. In further embodiments, the one or more detectors include a plurality of power detectors with a power detector being coupled to the quadrature combiner within each power amplifier. In still further embodiments, the method includes comparing the measurements to stored operational data, and the adjusting is based upon the comparing. In additional further embodiments, the stored operational data includes upper limits and lower limits.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
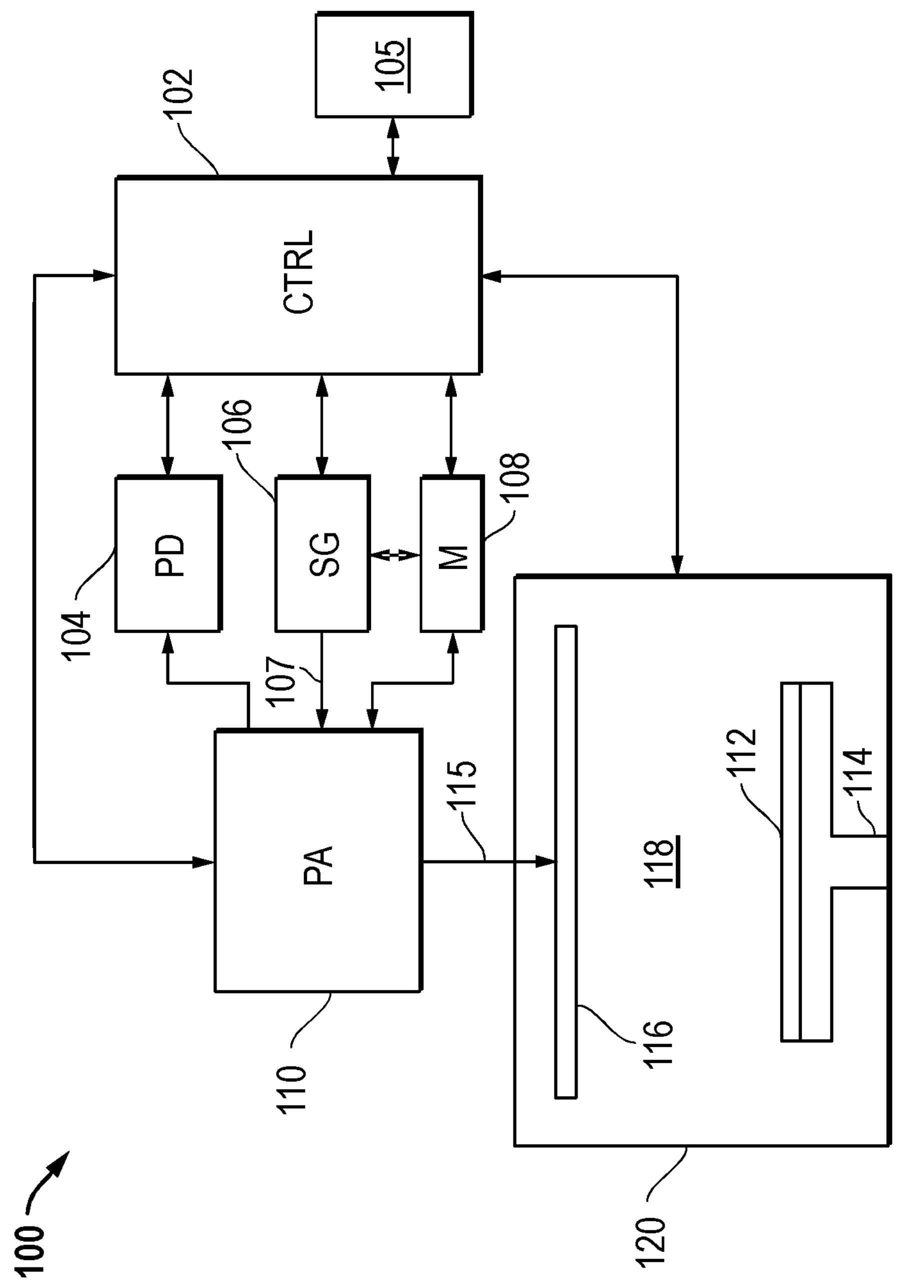
FIG. 1 is a block diagram of an example embodiment for a plasma processing system including a power amplifier system having power amplifiers with quadrature splitters/combiners as described herein.

Plasma processing creates non-linear loads for the processing system and related electronics. These non-linear loads are most visible at the radio frequency (RF) signal driven across the plasma sheath at the surface of the microelectronic workpiece (e.g., semiconductor wafer). These non-linear loads across the plasma sheath distort the top of the sine wave within the process chamber thereby generating harmonics of the RF energy. These harmonics, such as second harmonics, third harmonics, and above, can also be reflected back into electronics for the plasma processing system including the power amplifier system.

For embodiments described herein, quadrature splitters and combiners are used within power amplifier circuits for the generation of radio frequency (RF) energy within plasma processing systems. The use of quadrature splitters and combiners in part reduce or eliminate second harmonic distortion (and above) thereby improving stability of the plasma generated within plasma processing systems. For example implementations, transistors can be used for power amplification, and these can be included at each power amplifier stage for solutions having multiple power amplifier stages. For other implementations, integrated transistor modules can be mounted directly to components, such as cooling plates, within the plasma processing system. Other variations can also be implemented.

For one example high-power solution as described herein, outputs from an array of power amplifiers with quadrature splitters/combiners are combined in a final stage by an N-way radial combiner (e.g., six-way). Such an implementation, for example, can achieve high-power combined outputs in the high kilowatt (kW) range. For example, an operational range of this design can cover, for example, a power range from 1 kW to 10 kW. In general, the radial combiner at the final step is able to combine and deliver 600-1000 watts (W) and above from the different power amplifiers, for example, using surface mount technology. Water cooling can also be provided. In addition, to minimize phase noise over the operational frequency, RF circulators can be excluded from the power amplifier stages. As further described herein, electronic monitoring and control can be provided to protect transistors from high levels of reflected power. It is further noted that surface mount quadrature combiners and splitters are preferred where phase and power balance matching is desired. Other variations can also be implemented.

During operation, the quadrature splitters/combiners have a flat frequency response in operational ranges useful for plasma processing systems while acting as a filter for second and third harmonics. As indicated above, these second and higher harmonics can be generated from the plasma and reflected back into the power amplifier system. Stability of prior solutions suffered due to these harmonics. Certain disclosed embodiments includes two levels of such filtering with quadrature splitters placed after a pre-amplifier and quadrature combiners placed before outputs for the power amplifier stages. Other advantages and implementations can also be achieved while still taking advantage of the process techniques described herein.

Looking now to the drawings, FIG. 1 is a block diagram of an example embodiment for a plasma processing system 100 including a power amplifier system 110 having power amplifiers with quadrature splitters/combiners as described herein. A process chamber 120 includes a substrate holder 114 that holds a microelectronic workpiece 112, such as a semiconductor wafer. An upper electrode 116 receives RF output 115 from the power amplifier system 110, and the upper electrode 116 is used to ignite and maintain plasma within a processing region 118. This plasma is used for etch, deposition, and/or other process steps associated with the manufacture of the microelectronic workpiece 112. As described herein, the power amplifier system 110 can include one or more power amplifiers with quadrature splitters/combiners that receive an input signal 107 from a signal generator 106. A matching network 108 can be coupled to the signature generator 106 and/or to the power amplifier system 110, and the matching network 108 matches impedances to improve energy transfer. For one embodiment, the input signal 107 is a radio frequency (RF) signal having a frequency greater than or equal to one megahertz (1 MHz) and preferably from 3 MHz to 150 MHz or more.

Power monitoring and control can also be implemented with respect to the plasma processing system 100. For such embodiments, one or more power detectors 104 are coupled to the power amplifier system 110 to detect and generate measurements for various parameters related to power generation and operation. A controller 102 is coupled to receive measurements from the detectors 104 and is also coupled to the power amplifier system 110, the signal generator 106, the matching network 108, and/or the processing chamber 120. The controller 102 monitors the measurements from the detectors 104 and adjusts operation of the other components to facilitate plasma processing and to achieve target process parameters. Operational data including target process parameters and operational limits (e.g., upper limits and lower limits) can be stored in a non-volatile storage system 105 coupled to the controller 102, such as an EEPROM (Electrically Erasable Programmable Read-Only Memory) or other non-volatile memory.

Figure 2:
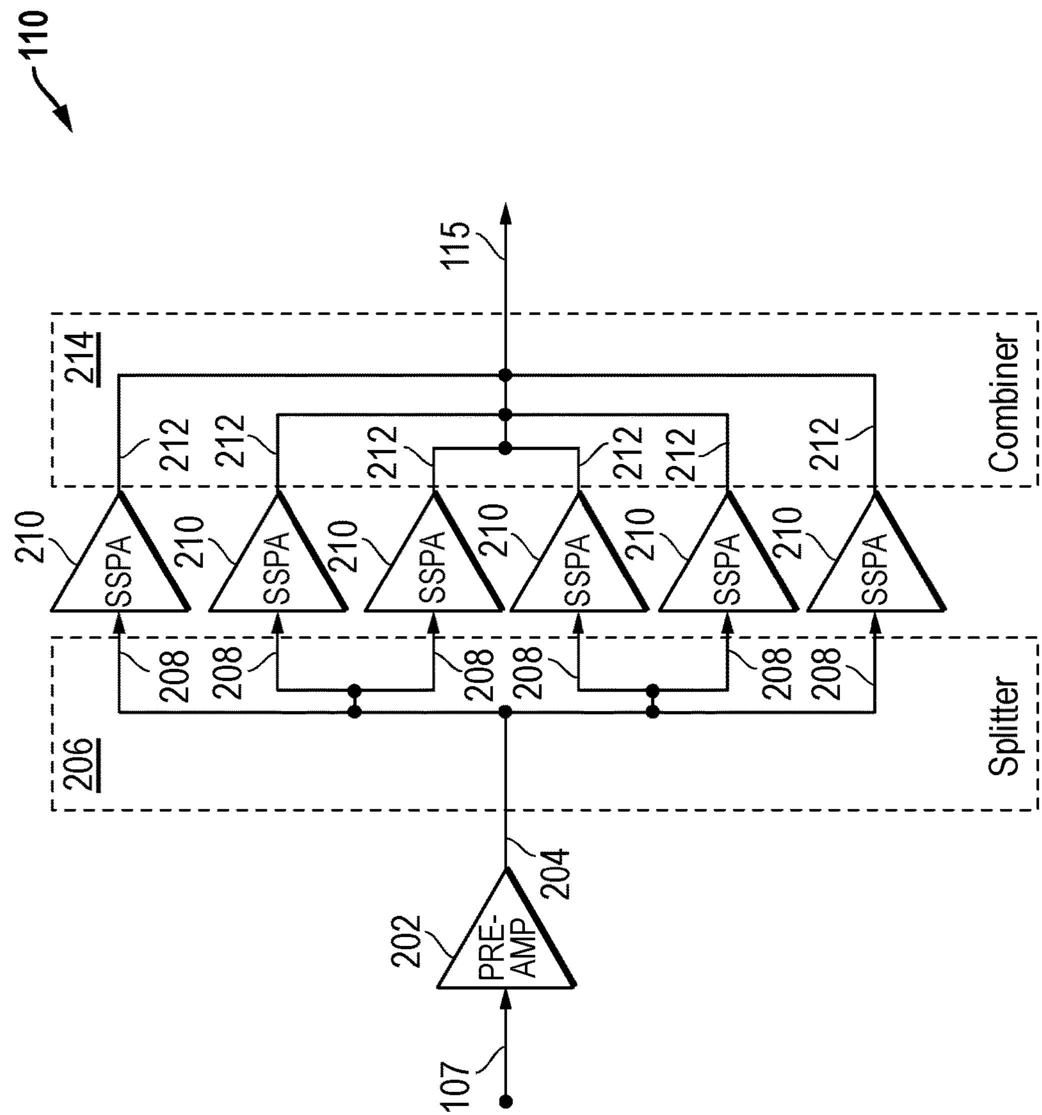
FIG. 2 is a diagram of an example embodiment for the power amplifier system including a plurality of power amplifier stages.

FIG. 2 is a diagram of an example embodiment for the power amplifier system 110 of FIG. 1 including a plurality of power amplifier stages that include quadrature splitters/combiners as described herein. For the embodiment of FIG. 2, the power amplifiers are solid state power amplifiers (SSPAs) 210. This example embodiment includes six (6) SSPAs 210 as the power amplifier stages that provide the RF output 115 as a combined output from the different power amplifiers 210. A pre-amplifier 202 receives the input signal 107 from the signal generator 106. The amplified output 204 from the pre-amplifier 202 is split by the splitter 206 into six paths, and one of the split input signals 208 is input to each of the six SSPAs 210. The amplified outputs 212 from the SSPAs 210 are combined by combiner 214 to generate the RF output 115. For one embodiment, the combiner 214 is a radial combiner. For one embodiment, the pre-amplifier 202 is a 20 watt pre-amplifier, and each of the SSPAs 210 is a 600 watt amplifier.

Figure 3:
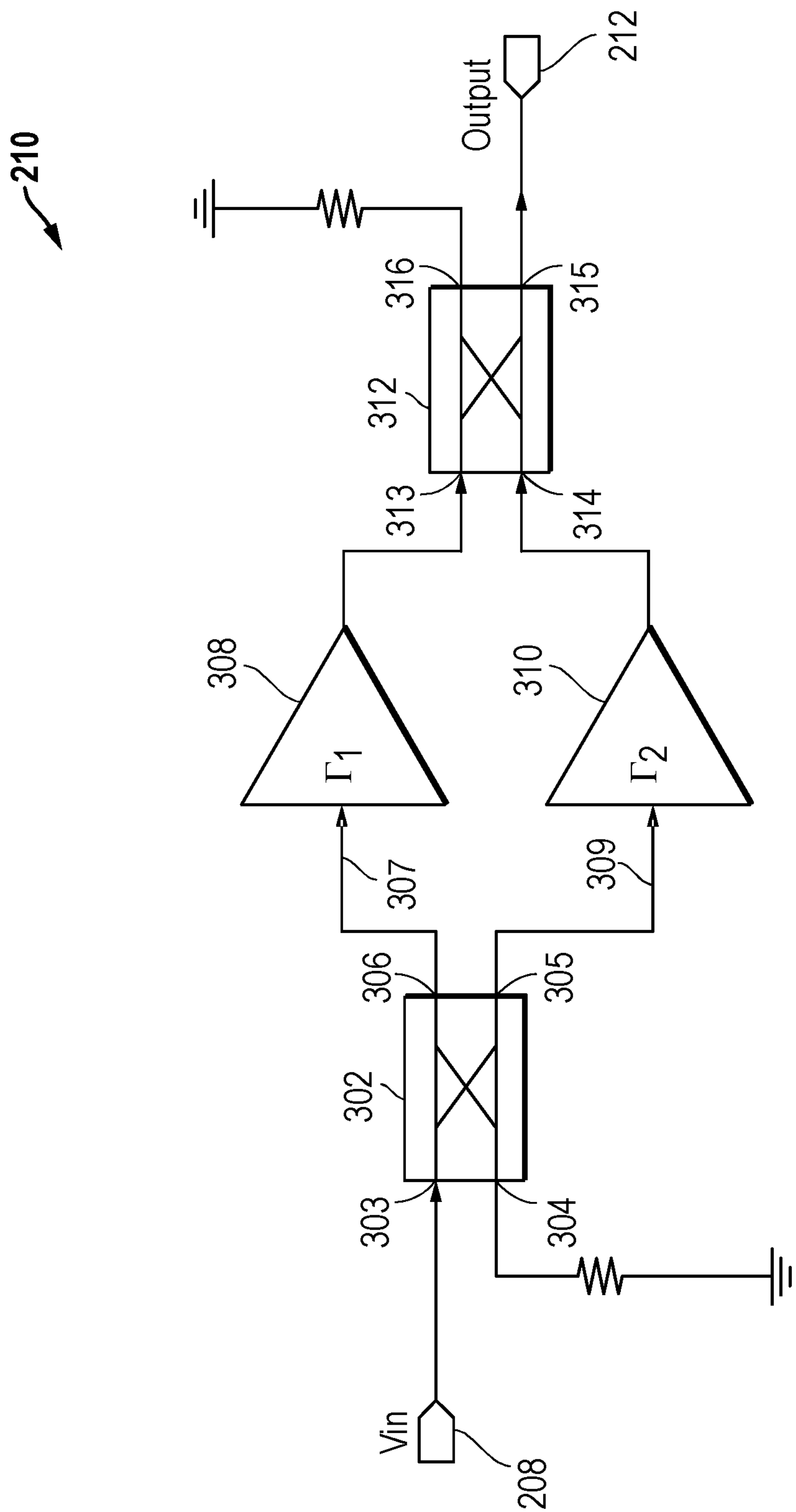
FIG. 3 is a diagram of an example embodiment for a solid state power amplifier (SSPA) that uses a quadrature splitter and quadrature combiner to facilitate stability and control of plasma generation.

FIG. 3 is a diagram of an example embodiment for a SSPA 210 that uses a quadrature splitter 302 and quadrature combiner 312 to facilitate stability and control of plasma generation. The split input signal 208 is coupled to input port 303 for the quadrature splitter 302. An isolation port 304 is coupled to ground, for example, through a resistor. The quadrature splitter 302 splits an input voltage ($V_{IN}$) for the split input signal 208 into two signals 307/309 that are quadrature signals with respect to each other. As such, the signals 307/309 have phases the different by ninety (90) degrees. For one embodiment, the quadrature splitter 302 outputs a ½ $V_{IN}$ signal having a phase of zero degrees as signal 307 from output port 306 and outputs a ½ $V_{IN}$ signal having phase of ninety (90) degrees as signal 309 from output port 305. The quadrature splitter 302 and quadrature combiner 312 are preferably narrow band. It is noted that a range for the narrow band based upon 3 dB or ½ power roll off frequencies can be ±20% of the center frequency or 6 dB per octave, where an octave is doubling or half the driven frequency. Other frequency ranges can also be used while still taking advantage of the techniques described herein.

The SSPA 210 also includes a first amplifier 308 and a second amplifier 310. The first amplifier 308 receives the signal 307 and outputs an amplified signal to input node 313 for the quadrature combiner 312. The second amplifier 310 receives the signal 309 and outputs an amplified signal to input node 314 for the quadrature combiner 312. The first amplifier has a first gain and a first reflection coefficient ($\Gamma_1$), and the second amplifier has a second gain and a second reflection coefficient ($\Gamma_2$). Preferably, the amplifiers 308/310 have the same gains that are matched to each other and also have the same reflection coefficients ($\Gamma_1=\Gamma_2$). For one embodiment, the SSPA 210 generates an output greater than or equal to 500 watts and preferably greater than or equal to 600 watts.

For one embodiment, the amplifiers 308/310 are implemented as power transistors such as gallium nitride (GaN) transistors. Preferably, such GaN transistors, including GaN transistor integrated circuit devices, are typically able to withstand short term instant reflected power. For example, providing 3 mil×1.5 mil (mil=0.001 inches) diameter gold bond wires per n-different pads in a transistor output, the transistor can withstand high power and thermal cycling in final output stage for a SSPA. Further, GaN transistor integrated circuits (ICs) can also be used to implement the amplifiers 308/310, and these GaN transistor ICs can operate with a source-drain voltage (Vds) of 50 volts DC (direct current). A high voltage converter operating from 400 volts to 50 volts can also be used.

The quadrature combiner 312 re-aligns the phases of the amplified signals from the amplifiers 308/310, combines them, and outputs the combined amplified signal 212 from the output port 315. An isolation port 316 for the combiner 312 is coupled to ground, for example, through a resistor. For one embodiment, the signal at input port 314 is shifted by ninety (90) degrees and combined with the input signal at input port 313.

In operation of the plasma processing system, the use of quadrature power splitters and combiners 302/312 in each SSPA 210 provide a number of advantages. For example, intermodulation distortion (IMD) is reduced, and power combining is balanced. In addition, the quadrature splitters and combiners 302/312 filter or reject second ($2^{nd}$) harmonic and third harmonic ($3^{rd}$) interference generated by the plasma within the process chamber. Further, where the amplifiers 308/310 have the same reflection coefficient ($\Gamma_1=\Gamma_2$), the power returned to the input cancels out and all of the reflected power goes to the load. This quadrature splitter/combiner architecture also removes the need for an input circulator to protect the driving amplifiers 308/310 form reflected power due to mismatched impedances and imbalances between transistors. A reflected signal that returns to the output of the SSPA 210 can bounce several times with each time being attenuated within the SSPA 210 by the quadrature splitters/combiners 302/312 and the isolation ports 304/316.

It is noted that additional embodiments and variations can also be implemented. For example, while quadrature power splitting/combining is shown, 180 degree power splitting/combining can also be used. Further, although six (6) amplifier stages are shown in FIG. 3 along with 2×2 port quadrature splitters/combiners, different numbers (N) of amplifier stages can be used as well as different splitter/combiner architectures.

Figure 4:
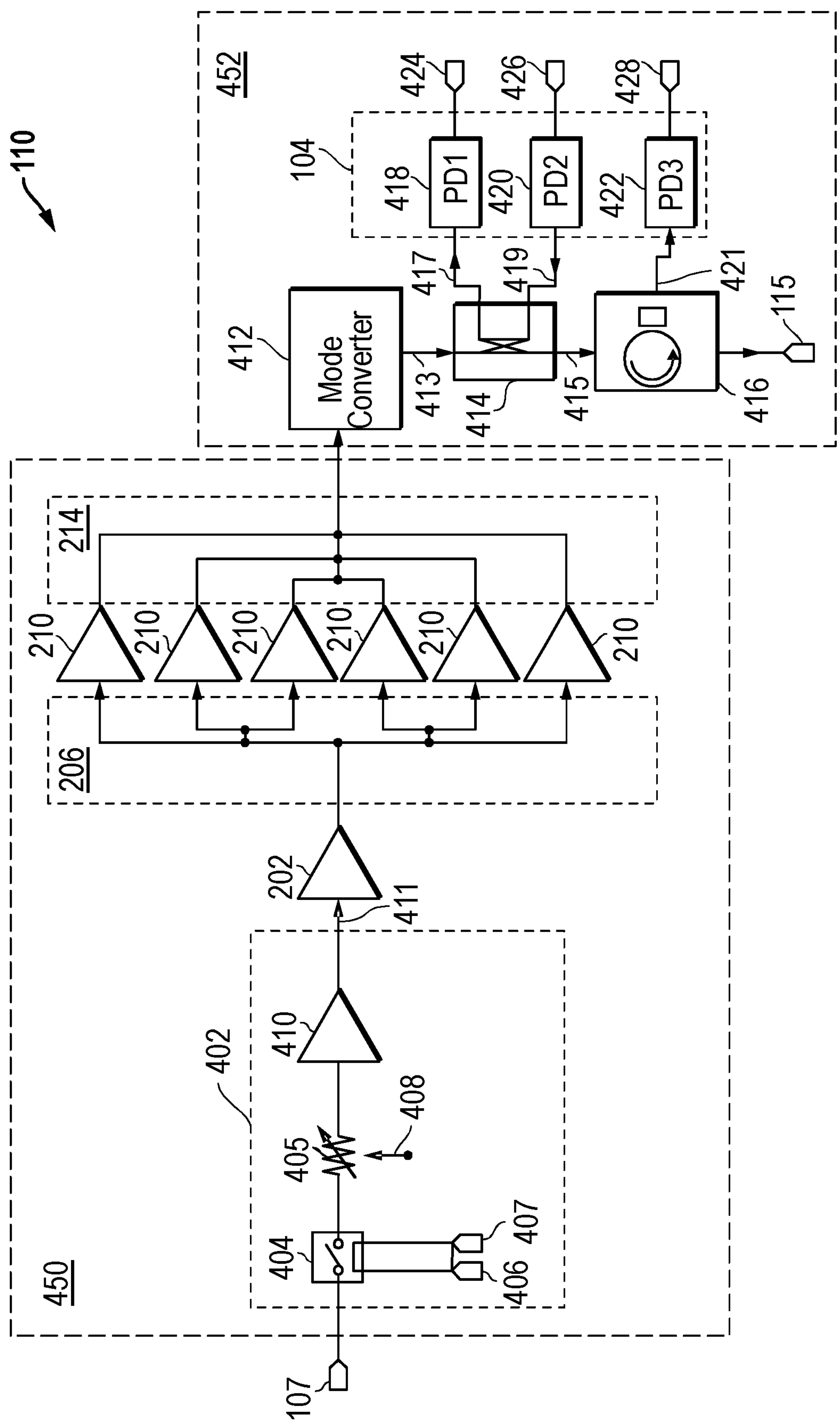
FIG. 4 is a diagram of an example embodiment for a power amplifier system including additional stages as compared to FIG. 2.

FIG. 4 is a diagram of an example embodiment for a power amplifier system 110 including additional stages as compared to FIG. 2. In addition to the pre-amplifier 202, combiner 206, SSPAs 210, and combiner 214 within an amplifier stage 450, the embodiment of FIG. 4 includes an additional output stage 452 along with an additional power control module 402 within the amplifier stage 450.

Looking first to the amplifier stage 450, a power control module 402 is coupled between the input signal 107 and the pre-amplifier 202. Within the power control module 402, a high-power switch 404 receives the input signal 107. For one embodiment, the high-power switch 404 is controlled by a current passing from control port 406 through control port 407. When closed, the switch 404 outputs the input signal

107 through attenuator 405 to an amplifier 410. For one embodiment, the attenuation provided by attenuator 405 to the input signal 107 is determined by control signal 408. The output 411 from the amplifier 410 is provided to the pre-amplifier 202. For one embodiment, the amplifier is a 1 watt amplifier. It is also noted that the control ports 406/407 and control signal 408 can be controlled by the controller 102 shown in FIG. 1.

As described with respect to FIG. 2, the pre-amplifier 202 provides an amplified output to the splitter 206. The splitter 206 then provides split input signals to the different power amplifier stages or SSPAs 210. The outputs of the SSPAs 210 are combined by combiner 214 into an RF output. For the embodiment of FIG. 4, this RF output is provided to the output stage 452 before being output as the RF output 115.

Looking now to the output stage 452, a mode converter 412 receives the combined RF output from the combiner 214. The mode converter 412, for example, can convert an RF coaxial signal from the amplifier stage 450 into an RF waveguide signal 413 that is output to a directional RF coupler 414. The directional RF coupler 414 receives the RF waveguide signal 413 and outputs an RF signal 415 to an RF circulator 416. The directional RF coupler 414 also generates a forward power ($P_F$) signal 417 and a reflected power ($P_R$) signal 419. The forward power ($P_F$) signal 417 represents the RF power passing through the directional RF coupler 414 to the RF signal 415. The reflected power ($P_R$) signal 419 represents any RF power that is reflected back through the directional RF coupler 414 towards the mode converter 412. The RF circulator 416 receives the RF signal 415 and outputs the RF output 115. The RF circulator 416 can also output a reflected power ($P_F$) signal 421 representing the power reflected and absorbed by the circulator by the mismatched impedance of the antenna plasma interface seen at RF output 115. For one embodiment, the RF output 115 is provided as an output for a radial line slot antenna (RLSA™) microwave plasma processing apparatus.

Power detectors 104 can also be included to facilitate monitoring and control of the power amplifier system 110. The power detector 418 is coupled to receive the forward power ($P_F$) signal 417 and outputs a forward power measurement 424. The power detector 420 is coupled to receive the reflected power ($P_R$) signal 419 and outputs a reflected power measurement 426. The power detector 422 is coupled to receive reflected power ($P_R$) signal 421 and outputs a power level measurement 428. It is noted that only power that is absorbed by the circulator 416 is visible on the 422 detector. Power not absorbed by the circulator 416 is detected by the directional coupler 414 through the reflected power ($P_R$) signal 419, and this not-absorbed power can include harmonics generated by the plasma as well as a fundamental frequency that was not absorbed by the circulator 416.

During operation, the forward power measurement 424, the reflected power measurement 426, and the reflected power measurement 428 are provided from power detector 104 to controller 102. Controller 102 in FIG. 1 monitors these power measurements 424/426/428 and adjusts the control ports 406/407 and the control signal 408 to adjust the RF output 115 generated by the power amplifier system 110. These control adjustments can be made to achieve target processing parameters for the plasma processing system 100.

Figure 5:
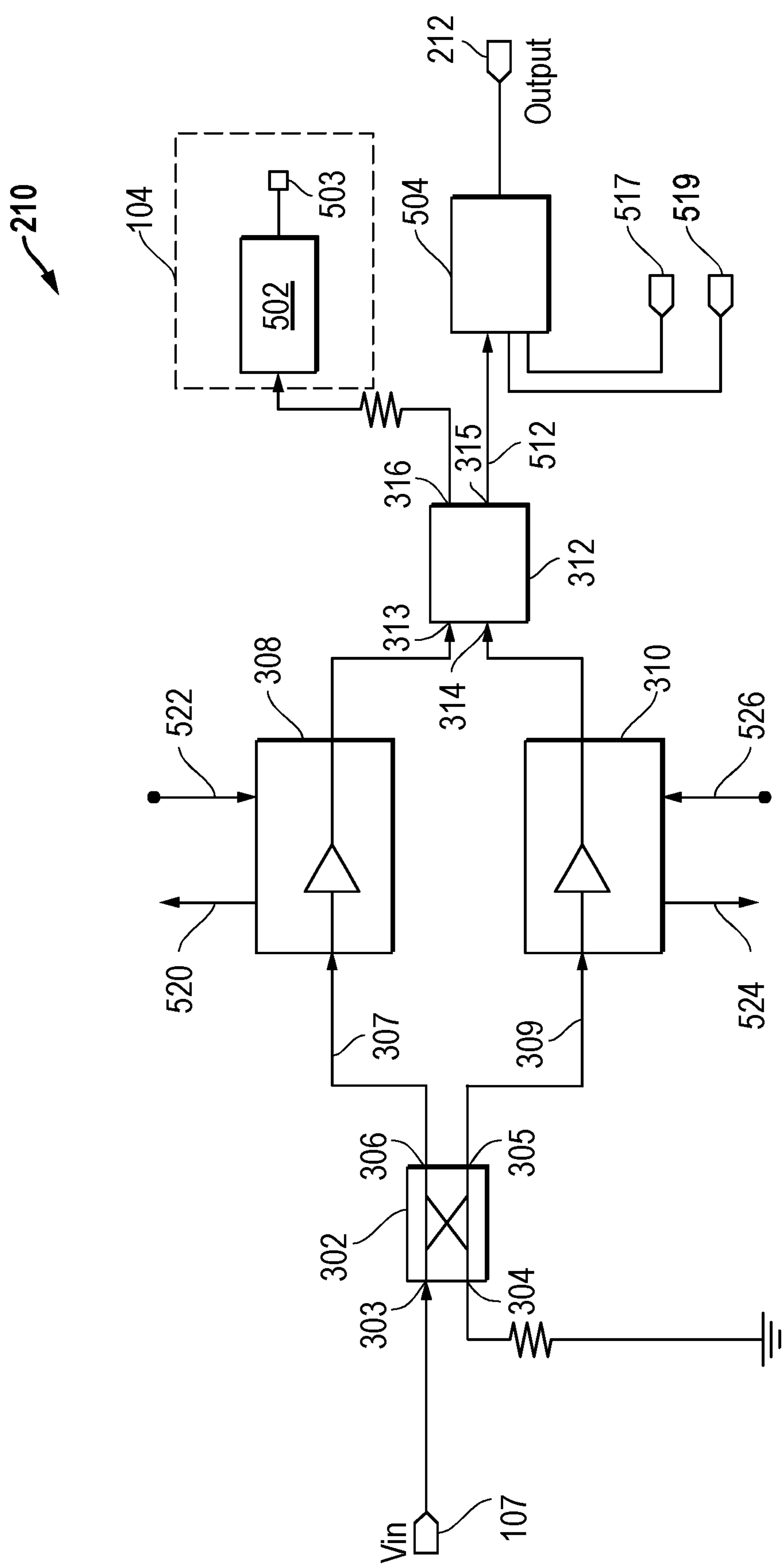
FIG. 5 is a diagram of a further example embodiment for an SSPA where control and monitor signals are shown for the internal amplifiers along with additional detector circuits that provide monitor outputs to a controller.

FIG. 5 is a diagram of a further example embodiment for an SSPA 210 where control and monitor signals are shown for the amplifiers 308/310 along with additional detector circuits that can be coupled to the controller 102. Similar to the embodiment of FIG. 3, a quadrature splitter 302 and quadrature combiner 312 are used to facilitate stability and control of plasma generation. For the embodiment of FIG. 5, the input signal 107 is coupled to input port 303 for the quadrature splitter 302. The isolation port 304 is coupled to ground, for example, through a resistor. As in FIG. 3, the quadrature splitter 302 splits an input voltage ($V_{IN}$) into two signals 307/309 having phases that differ by ninety (90) degrees. A first transistor amplifier 308 receives the signal 307 and outputs an amplified signal to input node 313 for the quadrature combiner 312. A second transistor amplifier 310 receives the signal 309 and outputs an amplified signal to input node 314 for the quadrature combiner 312. The quadrature combiner 312 re-aligns the phases of the inputs signals, combines them, and outputs the signal 512 from the output port 315 to an directional RF coupler 504 that measures the combined amplified signal 212.

For the embodiment of FIG. 5, the isolation port 316 is coupled to an RF power detector 502, for example, through an attenuator. The RF detector 502 operates as one of the RF power detectors 104 in FIG. 1 and generates an output signal 503 that provides an analog representation of the balanced power ($P_B$) through quadrature combiner 312. In addition, for the embodiment of FIG. 5, the directional RF coupler 504 generates a forward power ($P_F$) signal 517 and a reflected power ($P_R$) signal 519 associated with the individual SSPA 210. The forward power ($P_F$) signal 517 represents the RF power passing through the directional RF coupler 504 to the RF output 115. The reflected power ($P_R$) signal 519 represents any RF power reflected back through the direction RF coupler 504. Further, as shown in FIG. 5, an amplifier control signal 522 is coupled the amplifier 308, and a monitor signal 520 is output by the transistor amplifier 308. Similarly, an amplifier control signal 526 is coupled the amplifier 310, and a monitor signal 524 is output by the transistor amplifier 310. For one embodiment, the controls signals 522/526 are supply voltages (Vdd) for the transistor amplifiers 308/310, and the monitor signals 520/524 are gate voltage monitor signals for the transistor amplifiers 308/310.

Additional RF power detectors or other detectors can be used to generate digital measurements for the monitor signals 520/524 as well as the power signals 517/519. For example, circuitry can be coupled directly to the SSPAs 210 to facilitate efficient measurement and control. The digital measurements from these detector circuits along with an output 503 from RF detector 502 can be provided to the controller 102 in FIG. 1, and the controller 102 uses these measurements to monitor and control the SSPA 210 and/or the power amplifier system 110.

For one embodiment, the monitor signals 520/524 are monitored by the controller 102 and compared to high/low limits stored within the storage system 105, which is shown in FIG. 1. The gains for the transistor amplifiers 308/310 are then adjusted using the controls signals 522/526 based upon these comparisons. For example, where GaN transistors are used for the transistor amplifiers 308/310, operating values for gate-to-source voltages (Vgs) can be output as the monitor signals 520/524, and supply voltage (Vdd) set points are provided to the GaN transistors as the controls signals 522/526. For example, although Vgs is effectively set by the bias circuit the Vgs values can provide warning information in overdrive situations. Overdrive is where there is too much input power, or can represent conditions of high levels of reflected power (e.g., primarily, $2^{nd}$ harmonics), where damage can occur to the transistor amplifiers. Adjustments can be made to address these conditions based upon the monitoring. For additional embodiments, transistor current can also monitored using current sense resistors coupled to the transistor source-drain line, and these current signals can be included within the monitor signals 520/524. Still further, temperature for the transistor amplifiers or integrated circuits can also be monitored, for example, by placing a temperature sensor near the chip base. The resulting temperature measurements can also be provided to the controller 102. The controller 102 can then use current limits and/or temperature limits stored in the storage system 105 to adjust operation of the system.

For one embodiment with respect to FIG. 5, integrated balance monitoring is achieved using the RF detector 502 which is attached to the isolation port 316 of the quadrature combiner 312. The RF detector 502 can operate as a voltage root mean squared ($V_{RMS}$) detector to convert an RF input power from the isolation port 316 to a $V_{RMS}$ output signal 503. For one embodiment, the ADC 502 implements a $V_{RMS}$ detector using a single layer microstrip. This $V_{RMS}$ output signal 503 can be monitored by controller 102 and compared to limits stored in the storage system 105. For example, the controller 102 can monitor the $V_{RMS}$ output signal 503 to detect imbalances during assembly and test or in production of the SSPA 210.

During operation as described above, the output 512 from the quadrature combiner 312 is driven through the directional coupler 504, which can be a surface mount directional coupler. The forward power ($P_F$) signal 517 and the reflected power ($P_R$) signal 519 from the directional coupler 504 can be measured with a RF power detector. The resulting forward/reverse power measurements along with current, temperature, Vgs values, and/or other detected operating parameters can be monitored by controller 102 to control operation of the SSPAs 210 and the power amplifier system 110. For example, RF input power and voltage can be turned off (e.g., within microseconds) where monitored parameters indicated damage could occur to the transistor amplifiers 308/310. Further, forward power measurements associated with individual SSPAs 210 can be used to monitor balance of input power to the radial combiner 214. Still further, the combined output signal from the combiner 214 can be compared to forward power measured by the waveguide directional coupler 414 shown in FIG. 4. Thus, as described herein, power monitoring and related control can be implemented by the controller 102 using measurements form one or more power detectors 104 or other detector circuits as shown and described with respect to FIG. 1, FIG. 4, and FIG. 5. As such, the controller 102 can monitor and control various aspects of the power amplifier system 100 thereby protecting the overall system operation and maintaining reliability over time.

It is further noted that the techniques described herein may be utilized with a wide range of plasma processing systems. For example, the techniques may be utilized with plasma etch process systems, plasma deposition process systems or any other plasma process system.

Figure 6:
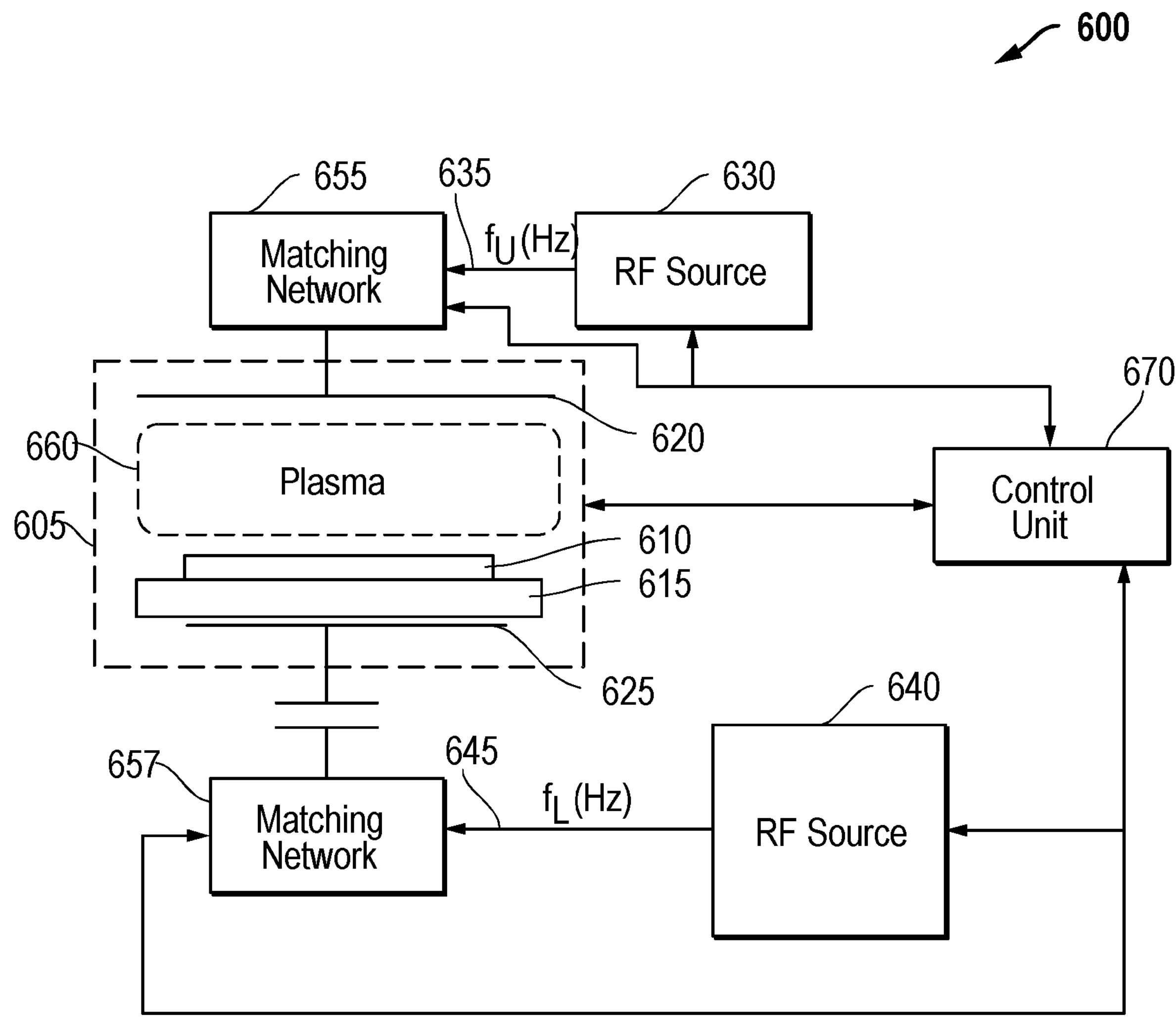
FIG. 6 provides one example embodiment for a plasma processing system that can be used with respect to the disclosed techniques and is provided only for illustrative purposes.

FIG. 6 provides one example embodiment for a plasma processing system 600 that can be used with respect to the disclosed techniques and is provided only for illustrative purposes. The plasma processing system 600 may be a capacitively coupled plasma processing apparatus, inductively coupled plasma processing apparatus, microwave plasma processing apparatus, (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 600 can be used for a wide variety of operations including, but not limited to, etching, deposition, cleaning, plasma polymerization, plasma-enhanced chemical vapor deposition (PECVD), atomic layer deposition (ALD) and so forth. The structure of a plasma processing system 600 is well known, and the particular structure provided herein is merely of illustrative purposes. It will be recognized that different and/or additional plasma process systems may be implemented while still taking advantage of the techniques described herein.

Looking in more detail to FIG. 6, the plasma processing system 600 may include a process chamber 605. As is known in the art, process chamber 605 may be a pressure controlled chamber. A substrate 610 (in one example a semiconductor wafer) may be held on a stage or chuck 615. An upper electrode 620 and a lower electrode 625 may be provided as shown. The upper electrode 620 may be electrically coupled to an upper RF source 630 through an upper matching network 655. The upper RF source 630 may provide an upper frequency voltage 635 at an upper frequency ($f_U$). The lower electrode 625 may be electrically coupled to a lower RF source 640 through a lower matching network 657. The lower RF source 640 may provide a lower frequency voltage 645 at a lower frequency ($f_L$). Though not shown, it will be known by those skilled in the art that a voltage may also be applied to the chuck 615.

Components of the plasma processing system 600 can be connected to, and controlled by, a control unit 670 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that since control unit 670 may be coupled to various components of the plasma processing system 600 to receive inputs from and provide outputs to the components.

The control unit 670 can be implemented in a wide variety of manners. For example, the control unit 670 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 660 in the process chamber 605 when applying power to the system from the upper RF source 630 and the lower RF source 640. Further, as is known in the art, ions generated in the plasma

660 may be attracted to the substrate 610. The generated plasma can be used for processing a target substrate (such as substrate 610 or any material to be processed) in various types of treatments such as, but not limited to, plasma etching, chemical vapor deposition, treatment of semiconductor material, glass material and large panels such as thin-film solar cells, other photovoltaic cells, and organic/inorganic plates for flat panel displays, etc.

Application of power results in a high-frequency electric field being generated between the upper electrode 620 and the lower electrode 625. Processing gas delivered to process chamber 605 can then be dissociated and converted into a plasma. As shown in FIG. 6, the exemplary system described utilizes both upper and lower RF sources. For example, high-frequency electric power, for an exemplary capacitively coupled plasma system, in a range from about 3 MHz to 150 MHz may be applied from the upper RF source 630 and a low frequency electric power in a range from about 0.2 MHz to 40 MHz can be applied from the lower RF source. It will be recognized that the techniques described herein may be utilized with in a variety of other plasma systems. In one example system, the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized, etc.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A power amplifier, comprising:

a quadrature splitter coupled to receive an input signal and having a first and second signals as outputs, the second signal being ninety degrees out of phase with respect to the first signal;

a first amplifier coupled to the first signal and having a first amplified signal as an output;

a second amplifier coupled to the second signal and having a second amplified signal as an output, the second amplified signal being ninety degrees out of phase with respect to the first amplified signal; and a quadrature combiner coupled to receive the first and second amplified signals and having a combined amplified signal as an output, the combined amplified signal comprising re-aligned versions of the first and second amplified signals, wherein the output from the quadrature combiner is provided to an electrode of a plasma process chamber, and wherein the quadrature combiner is configured to filter interference generated by plasma within the plasma process chamber.

2. The power amplifier of claim 1, wherein the combined amplified signal comprises a radio frequency (RF) signal having an output power greater than or equal to 500 watts at a frequency greater than or equal to two gigahertz.

3. The power amplifier of claim 1, wherein the first amplifier and the second amplifier each comprises one or more transistor amplifiers.

4. The power amplifier of claim 3, wherein the one or more transistor amplifiers comprise gallium nitride (GaN) transistors.

5. The power amplifier of claim 1, the quadrature combiner is coupled to a detector having measurements as outputs, wherein the detector is coupled to a controller, and wherein the controller is configured to adjust an operation of the power amplifier based on the measurements received from the detector.

6. A power amplifier system, comprising:

a splitter coupled to receive an input signal and having a plurality of split signals as outputs;

a plurality of power amplifiers, each power amplifier comprising:

a quadrature splitter coupled to receive one of the split signals and having a first and second signals as outputs, the second signal being ninety degrees out of phase with respect to the first signal;

a first amplifier coupled to the first signal and having a first amplified signal as an output;

a second amplifier coupled to the second signal and having a second amplified signal as an output, the second amplified signal being ninety degrees out of phase with respect to the first amplified signal; and a quadrature combiner coupled to receive the first and second amplified signals and having a combined amplified signal as an output, the combined amplified signal comprising re-aligned versions of the first and second amplified signals;

a combiner coupled to receive the combined amplified signals from the plurality of power amplifiers and to provide a combined output signal;

one or more detectors having measurements as outputs; and a controller coupled to receive the measurements and to adjust operation of the power amplifier system based upon the measurements.

7. The power amplifier system of claim 6, wherein the combined amplified signal for each of the power amplifiers comprises a radio frequency (RF) signal having an output power greater than or equal to 500 watts at a frequency greater than or equal to two gigahertz.

8. The power amplifier system of claim 6, wherein the combined output signal from the combiner is provided to a plasma process chamber, and wherein the quadrature combiner filters interference generated by plasma within the plasma process chamber.

9. The power amplifier system of claim 6, wherein the one or more detectors comprise a plurality of power detectors with a power detector being coupled to the quadrature combiner within each power amplifier.

10. The power amplifier system of claim 6, wherein each power amplifier further comprises a directional coupler coupled to the combined amplified signal and having a forward power signal and a reverse power signal as outputs, and wherein the one or more detectors comprise one or more power detectors coupled to the directional coupler within each power amplifier.

11. The power amplifier system of claim 6, further comprising a non-volatile storage system storing operational data associated with the one or more detectors.

12. The power amplifier system of claim 11, wherein the controller is coupled to adjust operation of the power amplifier system based upon a comparison of the measurements to the operational data.

13. The power amplifier system of claim 12, wherein the operational data comprises upper limits and lower limits.

14. A method, comprising splitting an input signal with a quadrature splitter to generate a first and second signals, the second signal being ninety degrees out of phase with respect to the first signal;

amplifying the first signal to generate a first amplified signal;

amplifying the second signal to generate a second amplified signal, the second amplified signal being ninety degrees out of phase with respect to the first amplified signal; and combining the first and second amplified signals with a quadrature combiner to generate a combined amplified signal, the combined amplified signal comprising re-aligned versions of the first and second amplified signals, wherein the combined amplified signal is provided to an electrode of a plasma process chamber, and wherein the quadrature combiner provides a filtering of an interference generated by plasma within the plasma process chamber.

15. The method of claim 14, wherein the combined amplified signal comprises a radio frequency (RF) signal having an output power greater than or equal to 500 watts at a frequency greater than or equal to two gigahertz.

16. The method of claim 14, wherein the splitting, amplifying, and combining are performed within a plurality of power amplifiers.

17. The method of claim 16, further comprising combining the combined amplified signals from the plurality of power amplifiers to generate a combined output signal.

18. The method of claim 16, wherein input signals for the plurality of power amplifiers comprise split signals from a second splitter.

19. The method of claim 14, further comprising adjusting at least one of the splitting, amplifying, or combining based upon measurements from one or more detectors.

20. The method of claim 19, wherein the one or more detectors comprise a plurality of power detectors with a power detector being coupled to the quadrature combiner within each power amplifier.

21. The method of claim 19, further comprising comparing the measurements to stored operational data, and wherein the adjusting is based upon the comparing.

22. The method of claim 21, wherein the stored operational data comprises upper limits and lower limits.

* * * * *